United States Patent [19]
Quan

[11] Patent Number: 5,631,446
[45] Date of Patent: May 20, 1997

[54] MICROSTRIP FLEXIBLE PRINTED WIRING BOARD INTERCONNECT LINE

[75] Inventor: Clifton Quan, Arcadia, Calif.

[73] Assignee: Hughes Electronics, Los Angeles, Calif.

[21] Appl. No.: 485,067

[22] Filed: Jun. 7, 1995

[51] Int. Cl.[6] .................................................. H05K 1/14
[52] U.S. Cl. ...................... 174/254; 333/238; 333/246; 174/261
[58] Field of Search ................................. 333/236, 238, 333/239, 241, 243, 1, 246, 81 A, 33; 174/254, 261; 361/749; 439/67, 77

[56] References Cited

U.S. PATENT DOCUMENTS

| | | | |
|---|---|---|---|
| 4,494,083 | 1/1985 | Josefsson et al. | 333/33 |
| 4,808,274 | 2/1989 | Nguyen | 204/15 |
| 4,887,054 | 12/1989 | Stern et al. | 333/159 |
| 4,906,953 | 3/1990 | Li et al. | 333/33 |
| 4,991,665 | 2/1991 | Kueneman | 174/34 |
| 5,426,399 | 6/1995 | Matsubayashi et al. | 333/1 |
| 5,452,182 | 9/1995 | Eichelberger et al. | 361/749 |

OTHER PUBLICATIONS

"CIN–APSE A New Patented Technology Bringing PC Interconnects Up To Speed," Elastomeric Technologies Incorporated.
"Wire Button Contacts," C. Pike et al., Electronic Products, Nov. 1989.
"Fuzz Button Board Assembly," Tecknit.

*Primary Examiner*—Laura Thomas
*Attorney, Agent, or Firm*—Leonard A. Alkov; Wanda K. Denson-Low

[57] ABSTRACT

An RF flexible printed wiring board transmission line for connecting strip transmission line microwave assemblies without the use of coaxial connectors and coaxial cables. The flexible transmission line includes a thin flexible dielectric ribbon, having on one side a ground plane layer and on the other side a microstrip conductor strip. Plated through holes at the ends of the flexible line provide access to both the ground plane and conductor strip on the same side of the flexible line, to facilitate interconnection of the microwave assemblies to the flexible line. The flexible line operates at microwave frequencies with little or no radiation leakage.

14 Claims, 4 Drawing Sheets

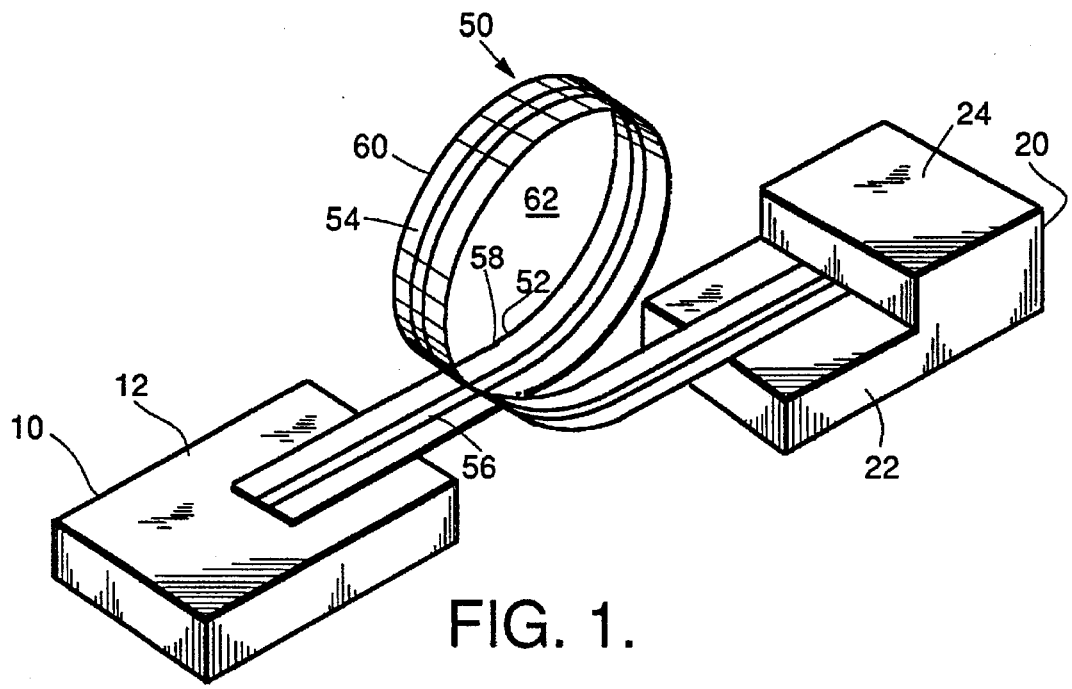
FIG. 1.
FIG. 2b.
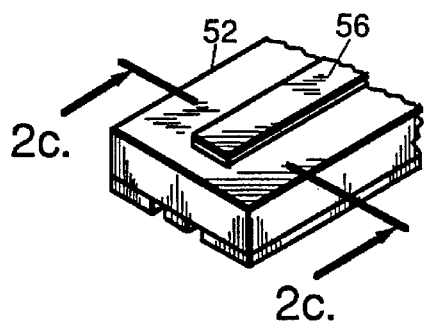
FIG. 2a.
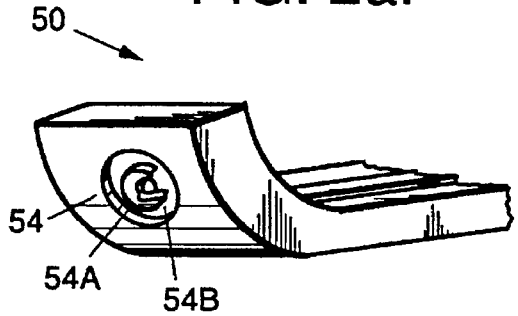
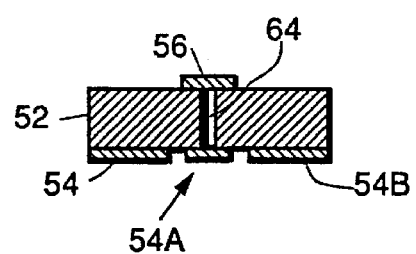
FIG. 2c.

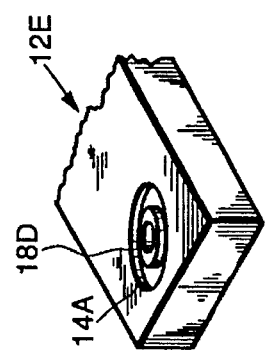
FIG. 5E.
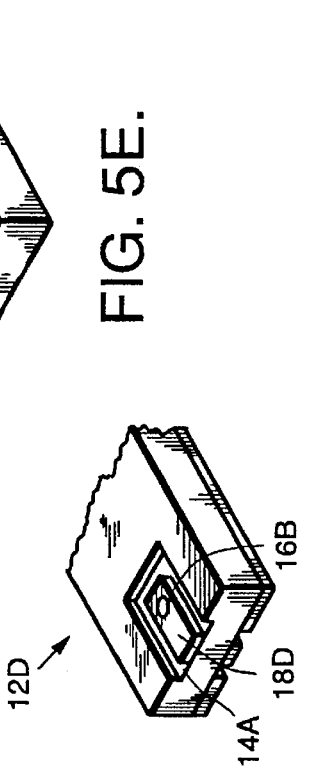
FIG. 5D.
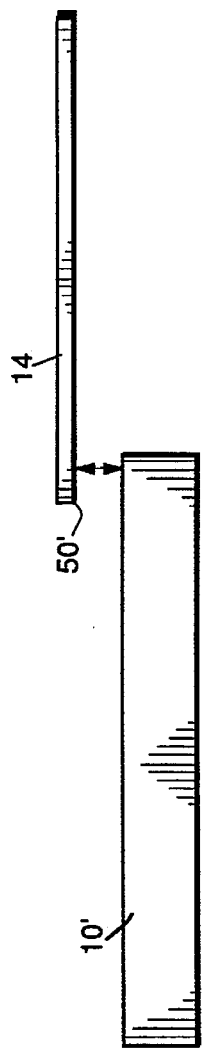
FIG. 5C.
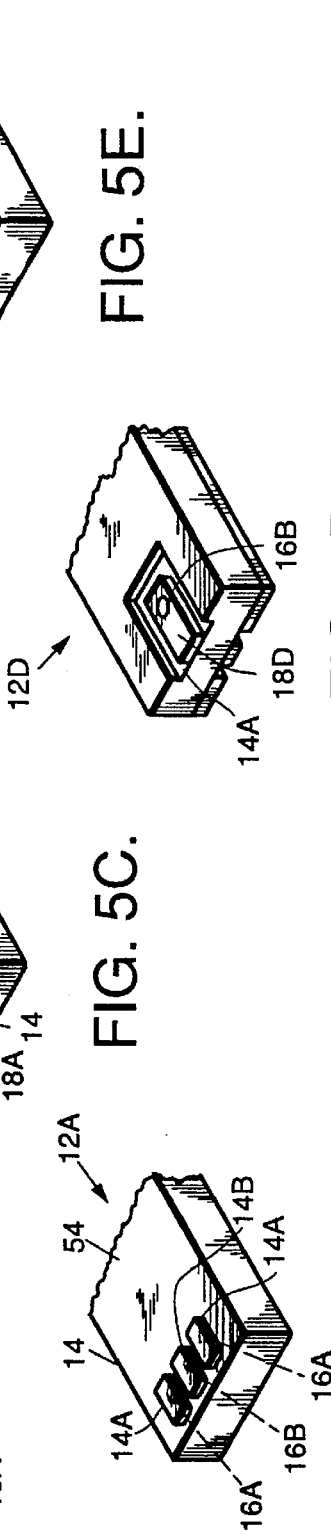
FIG. 5B.
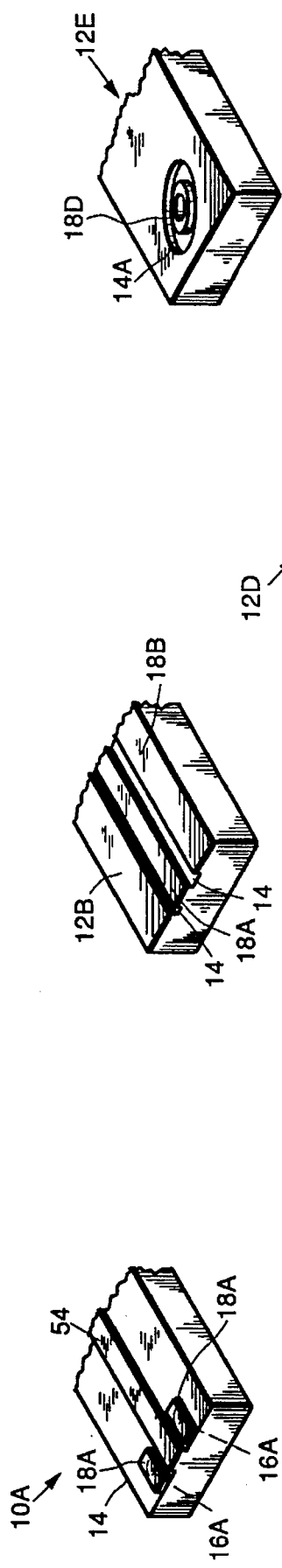
FIG. 5A.
FIG. 6A.

5,631,446

MICROSTRIP FLEXIBLE PRINTED WIRING BOARD INTERCONNECT LINE

TECHNICAL FIELD OF THE INVENTION

The present invention relates to microstrip transmission lines, and more particularly to a flexible microstrip transmission line useful for connecting strip transmission line microwave printed wiring board (PWB) assemblies without the use of coaxial connectors and coaxial cables.

BACKGROUND OF THE INVENTION

A conventional technique for providing interconnection between two RF assemblies is to use coaxial connectors and cables. The cables are bulky and difficult to route.

Flexible printed wiring board and flat ribbon cables are known, but do not operate at microwave frequencies.

Gold ribbons and wires, wire button contacts and elastomer connectors are sometimes used for RF interconnection, but are operational only for short distances. Elastomer connectors are compressible dielectric members impregnated with conductors, which, upon compression, achieve DC conduction only in a single direction. The conductors which impregnate the dielectric are thin in comparison to the thickness of the elastomer dielectric, so that the conductors assume the shape of the dielectric.

SUMMARY OF THE INVENTION

The invention addresses the problems and deficiencies of the prior art noted above, by providing an RF flexible printed wiring board (PWB) transmission line used to connect strip transmission line microwave PWB assemblies without the use of coaxial connectors and coaxial cables. The flexible PWB transmission line operates at microwave frequencies with little or no RF distortion as a function of flex or twist, and with little or no RF leakage. The flexible line is thinner than coaxial cables.

The PWB transmission line apparatus in accordance with an aspect of the invention is for electrically interconnecting first and second strip transmission lines located on first and second dielectric substrates, and comprises a flexible microstrip transmission line. The flexible line includes an elongated thin dielectric layer having first and second opposed surfaces, an electrically conductive ground plane layer formed on the first surface, an electrically conductive microstrip conductor strip formed on the second dielectric surface, and interconnection means for interconnecting a first end of the flexible line to the first strip transmission line and for interconnecting a second end of the flexible line to the second strip transmission line. In one exemplary embodiment, the flexible transmission line is passed through a 360 degree loop between the first and second strip transmission lines to provide strain relief.

The invention can interconnect strip transmission line microwave PWB assemblies with fewer RF connector components and in less RF connector volume than conventional connection techniques.

BRIEF DESCRIPTION OF THE DRAWING

These and other features and advantages of the present invention will become more apparent from the following detailed description of an exemplary embodiment thereof, as illustrated in the accompanying drawings, in which:

FIG. 1 is an isometric view of a microstrip flexible interconnect circuit embodying this invention, used to provide a circuit connection between physically displaced stripline circuits.

FIGS. 2A, 2B and 2C are respective bottom, top and cross-sectional views of the microstrip flexible interconnection circuit of FIG. 1.

FIGS. 5A–5E are respective top views of flexible microstrip interconnection circuits with alternate connection port configurations. FIG. 5A shows a microstrip with grounded PTH output pads for output port (edge board attachment). FIG. 5B illustrates a buried stripline and ground planes for PTH pads for the output port (edge board attachment). FIG. 5C shows a coplanar waveguide (CPW) output port (edge board attachment). FIG. 5D illustrates a buried stripline and top ground planes with center conductor PTH pad for output port (edge board attachment). FIG. 5E illustrates a buried stripline and top ground planes with center conductor PTH pad (center board attachment).

FIG. 6A is a side exploded view showing a strip transmission line circuit board and a microstrip flexible interconnect line having a top center conductor trace.

DETAILED DESCRIPTION OF THE PREFERRED EMBODIMENT

Figure 3A:
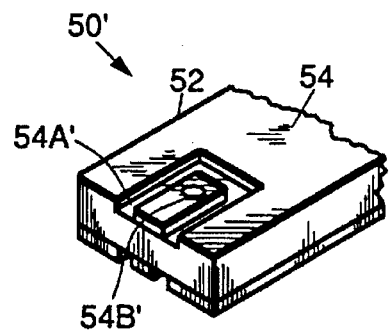
FIGS. 3A, 3B and 3C are respective bottom, top and cross-sectional views of a first alternate configuration of a microstrip flexible interconnection circuit in accordance with the invention.

The invention is a class of RF flexible PWB transmission lines used to connect strip transmission line microwave PWB assemblies without the use of coax connectors and coaxial cables. The invention can interconnect strip transmission line microwave PWB assemblies with fewer RF connector components and in less RF connector volume than that occupied by conventional connector apparatus. The invention uses flex PWB line fabrication technology to create a flexible microstripline interconnection circuit. This flexible line is designed to operate at microwave frequencies with little or no RF distortion as a function of flex or twist. Little or no radiation leakage has been detected from the line up to 8 inches in length.

An exemplary embodiment is shown in FIG. 1. First and second stripline circuit boards 10 and 20 each have formed on respective upper surfaces 12 and 22 microwave stripline transmission lines (not shown in FIG. 1) in a conventional manner. It is desired to provide a flexible RF interconnection between the respective stripline transmission lines. Such an interconnection is provided by flexible microstrip interconnection line 50. Circuit 50 may provide, by way of example, a connection between a T/R module 24 on board 20 and an RF stripline feed on board 10 in an active array antenna assembly. The flexible line 50 comprises a flexible dielectric circuit board 52 having formed on one surface 60 a conductive ground plane layer 54. A microstrip top conductor trace 56 is formed on the opposed surface 58 of the dielectric circuit board 52.

The flexible line 50 is in this exemplary embodiment arranged in a loop 62, so that the line provides physical tolerance relief as well as an RF connection between the microwave stripline circuit board assemblies 10 and 20. The line 50 operates at microwave frequencies even when the line is bent and twisted.

In this embodiment, the dielectric circuit board 52 is a thin layer of dielectric material such as 5880 RT/Duroid (TM) and Kapton (TM) having a thickness of 0.005 inch, and a width of at least 0.060 inch. The ground plane layer and microstrip trace are formed on surfaces of the dielectric layer by conventional photolithographic techniques. A protective dielectric coating may be applied to cover the microstrip center conductor. Other materials suitable for the flexible dielectric board 52 include TEFLON (TM), KEVLAR (TM) and MYLAR (TM).

FIGS. 2A, 2B and 2C are respective bottom, top and cross-sectional views of the microstrip flexible interconnection circuit 50 of FIG. 1. Attaching the thin flexible interconnect line to the strip transmission line assemblies 10 and 20 is done by electrically connecting either the ground or microstrip conduction line to the common surface with plated through via holes. The configuration shown in FIGS. 2A–2C employs plated through holes to provide connecting pads on the same surface side as the ground plane for surface mount attachment to the circuit board 10 or 20. The bottom view of FIG. 2A shows the clearance opening 54A formed in the conductive ground plane layer 54. A center conductor pad 54B is in turn formed in the center of the opening 54A. A plated through hole 64 is formed through the dielectric layer 52 between the pad 54B and the center conductor trace 56 formed on the opposite surface of the dielectric layer from the ground plane 54 as more particularly shown in FIGS. 2B and 2C.

Figure 3B:
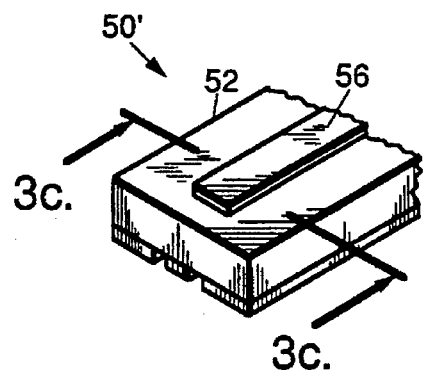
Figure 3C:
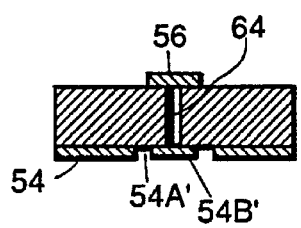

FIGS. 3A, 3B and 3C are respective bottom, top and cross-sectional views of a first alternate configuration of a microstrip flexible interconnection circuit 50' in accordance with the invention. In this configuration, a rectilinear clearance region 54A' adjacent an end of the dielectric layer 52 is defined in the conductive ground plane layer 54. The conductive pad 54B' also has a rectilinear configuration. A plated through hole 64 is formed through the dielectric layer 52 to connect the center conductor trace 56 to the pad 54B'. Thus, the embodiment of FIGS. 3A–3C also provides surface mount attachment of the flexible interconnection circuit 50' to the circuit board.

Figure 4A:
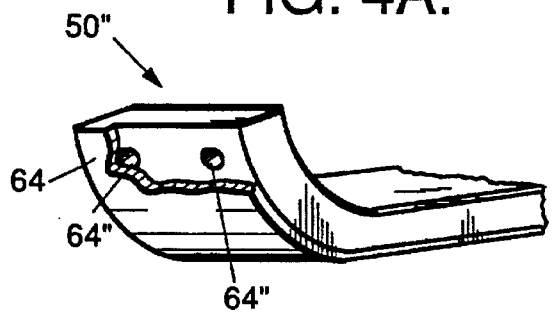
FIGS. 4A, 4B and 4C are respective bottom, top and cross-sectional views of a second alternate configuration of a microstrip flexible interconnection circuit in accordance with the invention.
Figure 4B:
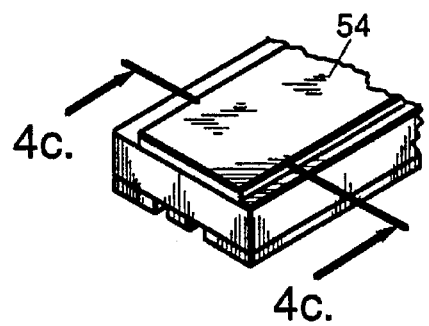
Figure 4C:
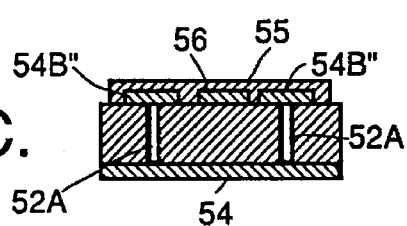

FIGS. 4A, 4B and 4C are respective bottom, top and cross-sectional views of a second alternate configuration of a microstrip flexible interconnection circuit 50" in accordance with the invention. The circuit 50" uses plated through holes 64" to interconnect the ground plane surface 54 to connecting pads 54B" defined on the same side of the dielectric substrate as the center conductor trace 56 for surface mount attachment to the circuit board. This embodiment employs a thin protective dielectric coating 55 formed over the center conductor 56 and most of the surface of the dielectric substrate 52. The coating 55 does not extend over the end of the interconnection circuit 50" so as not to cover the interconnection pads 54B" and the end of the center conductor strip 54. The coating 55 can be a thin layer of TEFLON (TM), KEVLAR (TM) or Parylene (TM).

The strip circuit board assemblies 10 and 20 can be configured in various ways to accept the microstrip flexible line 50 as an interconnection apparatus. FIGS. 5A–5E illustrate several exemplary configurations. Each of these views is a top view of a strip circuit board.

FIG. 5A shows a strip circuit board 10A which has a microstrip center conductor trace 12A on the top surface of a dielectric substrate 14. A ground plane (not shown) is applied to the bottom surface of the substrate 14. Plated through holes 16A run through the dielectric between the ground plane and the plated through hole (PTH) pads 18A at the edge of the circuit board 10A. Thus, the pads 18A and microstrip center conductor 12A form an output port for board edge attachment to a microstrip flexible interconnection circuit 50' as shown in FIGS. 3A–3C.

FIG. 5B shows a buried stripline board 12B comprising a stripline conductor strip (not shown) formed on a first surface of a lower dielectric substrate (not shown). A bottom ground plane layer (not shown) is formed on the second surface of the lower dielectric substrate. An upper dielectric substrate 14 is placed adjacent the second surface of the lower dielectric substrate, burying the stripline conductor strip between the first and second dielectric substrates. Two plated through holes 16A extend through the two substrates between the ground plane layer and the top surface of the second dielectric substrate 14 to conductive pads 14A. A third plated through hole 16B extends from conductive pad 14B through the top dielectric substrate 14 only to the stripline conductor. Thus, the flexible interconnection circuit 50 can be connected at the edge of the board 12B.

FIG. 5C shows a circuit board 12C including a dielectric substrate 14 having a coplanar waveguide (CPW) transmission mission line formed on an upper surface of the dielectric substrate 14. The CPW line includes a center conductor strip 18A and two top surface ground strips 18B. Typically, a bottom ground plane layer (not shown) will be applied to the lower surface of the dielectric substrate. The flexible interconnection circuit 50 can be connected at the edge of the board 12C to the conductor strips 18A and 18B.

FIG. 5D illustrates a strip transmission line circuit board 12D wherein a stripline center conductor is buried between upper and lower dielectric substrates as in FIG. 5B, and having a top ground plane layer 18C defined on the top surface of the upper dielectric substrate 14A. To connect the center conductor strip of the flexible interconnection circuit 50 to the buried stripline conductor of the board 12D, a plated through hole 16B extends only between the PTH conductive pad 18D and the buried stripline conductor. A rectilinear open region is formed between the pad 18D and the ground plane layer 18C.

FIG. 5E illustrates a strip transmission line circuit board 12E which is very similar to board 12D, except that the center conductor pad 18D is circular and located off the edge of the board.

The flexible interconnection circuits in accordance with the invention are thinner than coaxial cables. 30 mil radius bends have been achieved with no amplitude nor phase distortion up to 15 GHz. For one interconnect line fabricated as described above, and having a length of 5.75 inches, the return loss (SMA connectors included) is better than −20 dB at each port up to 15 Ghz; the insertion loss (SMA connectors included) is −0.5 dB at 10 Ghz.

Attaching the thin flexible interconnect line to the various strip transmission line assemblies 10 and 20 is done by electrically connecting either the ground or microstrip conductor line to the common surface with plated through via holes. The strip transmission line I/O ports of the circuit boards 10 and 20 will have similar conductor line pad patterns and ground pad patterns for alignment and solder connections.

Figure 6B:
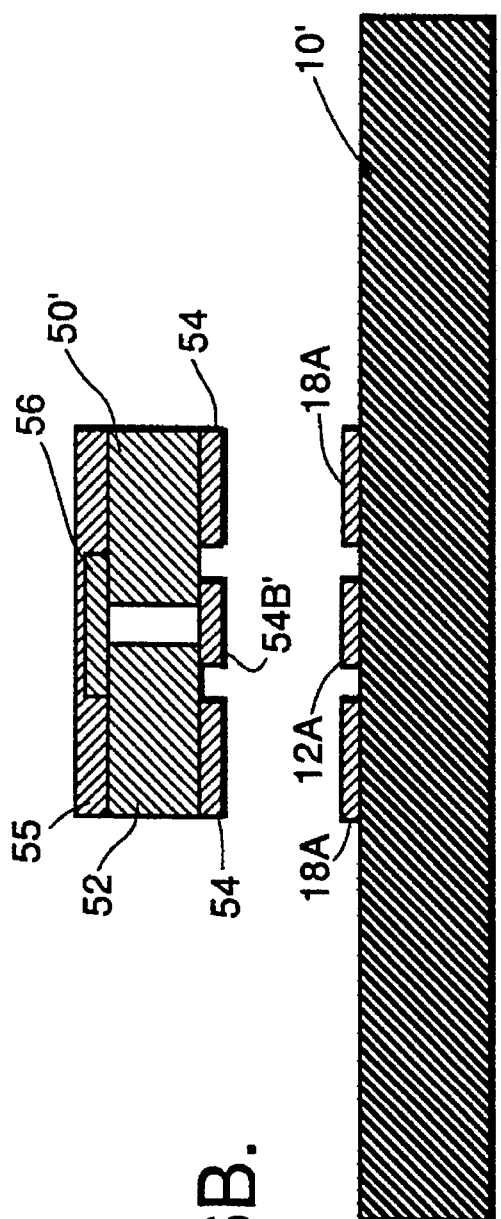
FIG. 6B is an end enlarged view, illustrating the manner in which the flexible microstrip interconnect line is connected to the strip transmission circuit board.

FIG. 6A is a side exploded view showing a strip transmission line circuit board 10' and a microstrip flexible interconnect circuit 50' having a top center conductor trace 56, as illustrated in FIGS. 3A–3B. FIG. 6B is an end enlarged view, illustrating the manner in which the flexible microstrip interconnect circuit 50' is connected to the strip transmission circuit board 10'. The top trace 56 is connected to the pad 54B' on the lower surface of the dielectric layer 52 by a plated through hole 64. A flexible protective coating 55 covers the surface of the substrate 52 on which the center conductor strip 56 is formed. The board 10' could have the transmission line configuration of any of the boards shown in FIGS. 5A–5E. Assume, for example, that the board has a microstrip center conductor strip 12A with grounded pads 18A on the upper dielectric surface, the pads connecting to the ground plane layer (not shown in FIG. 6B). The circuit 50' is attached to the circuit board 10' by conductive epoxy or solder, wherein the pad 54B' is attached to the microstrip center conductor strip 12A, and the pads 18A are attached to the bottom conductive layer 54 of the interconnection circuit 50'.

Figure 7:
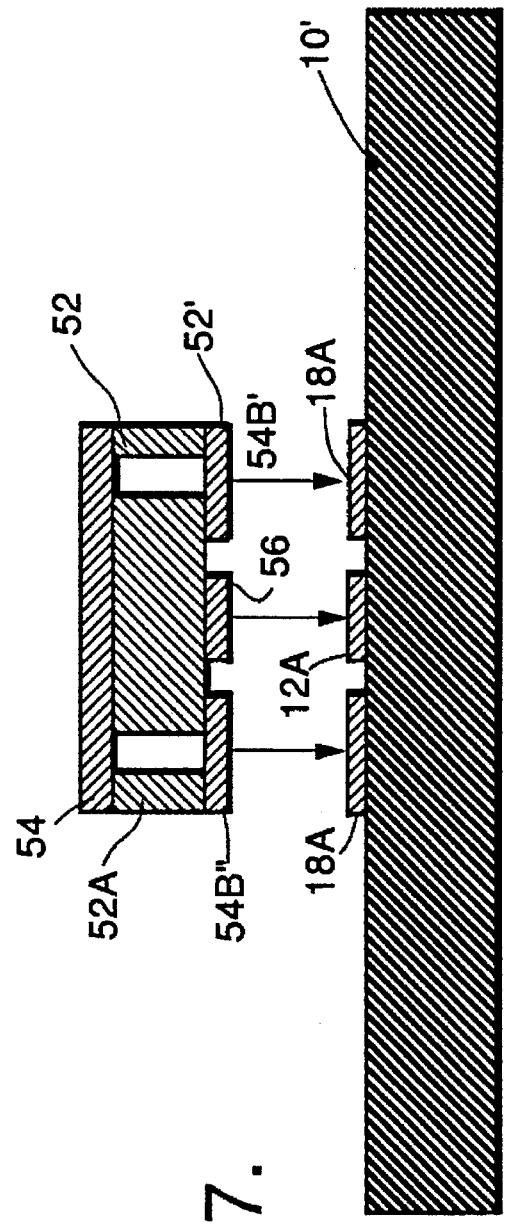
FIG. 7 is an end exploded view showing a strip transmission line circuit board and a microstrip flexible interconnect line having a bottom center conductor trace, illustrating the manner in which the flexible microstrip interconnect line is connected to the strip transmission circuit board.

FIG. 7 is an end exploded view showing a strip transmission line circuit board 10' and a microstrip flexible interconnect 50" having a center conductor trace 56 located on the bottom surface of the dielectric layer 52, and the ground plane 54 located on the upper surface of the layer 52, i.e. the configuration shown in FIGS. 4A–4C. FIG. 7 illustrates the manner in which the flexible microstrip interconnect circuit 50" is connected to the strip transmission circuit board 10". Assume the board 10' is identical to that of FIGS. 6A–6B. The pads 54B" are attached by conductive epoxy or solder to the pads 18A. The center conductor strip 56 is attached similarly to the microstrip conductor strip 12A of the circuit board 10'.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. Apparatus for electrically interconnecting first and second strip transmission line assemblies located on first and second dielectric substrates, comprising:

a microstrip flexible transmission line, said flexible line including an elongated thin flexible dielectric layer having first and second opposed surfaces;

an electrically conductive ground plane layer formed on said first surface;

an electrically conductive microstrip conductor formed on said second dielectric surface;

first interconnection means for interconnecting a first end of said flexible line to said first strip transmission line assembly, wherein said first strip transmission line assembly includes a first dielectric substrate, a first conductor formed on a first surface of said first substrate, and a first ground plane layer formed on a second surface of said first substrate, wherein said first interconnection means includes, (i) means for forming a first electrical interconnection between said first conductor and said microstrip conductor, (ii) means for forming a second electrical interconnection between said first ground plane layer of said first strip transmission line assembly and said ground plane of said conductive mocrostrip line of said flexible line, (iii) an open region defined in said mocrostrip ground plane layer, said open region free of conductive layer material, said open region separating said ground plane layer from a first conductive pad formed on said first surface, (iv) a first conductive plated through hole formed through said thin dielectric layer and interconnecting said microstrip conductor and said first conductive pad said first conductive pad in electronic connection with said first conductor, (v) a second conductive plated through hole formed through said first substrate between said ground plane layer and a second conductive pad formed on said first surface of said first substrate, said second conductive pad in electrical conduction with said ground plane of said microstrip flexible line;

wherein said first interconnection means provides surface mount attachment of said first end of said flexible line to a surface defined by said first strip transmission line assembly and surface mount attachment of said ground plane of said microstrip flexible line to an exposed surface defined by said first strip transmission line assembly; and second interconnection means for interconnecting a second end of said flexible line to said second strip transmission line assembly.

2. The apparatus of claim 1 wherein said microstrip flexible transmission line is passed through a 360 degree loop between said first and second strip transmission line assemblies to provide strain relief.

3. The apparatus of claim 1 wherein said microstrip flexible transmission line includes a flexible printed wiring board.

4. The apparatus of claim 1 wherein said flexible microstrip transmission line includes a thin flexible dielectric protective coating formed over said microstrip center conductor strip.

5. The apparatus of claim 1 wherein said first conductive pad is soldered to said first strip conductor to provide electrical connection therebetween.

6. The apparatus of claim 1 wherein said first conductive paid is adhered to said first strip conductor by conductive epoxy.

7. Apparatus for electrically interconnecting first and second strip transmission line assemblies located on first and second dielectric substrates, comprising:

a microstrip flexible transmission line, said flexible line including an elongated thin flexible dielectric layer having first and second opposed surfaces;

an electrically conductive ground plane layer formed on said first surface;

an electrically conductive microstrip conductor formed on said second dielectric surface;

first interconnection means for interconnecting a first end of said flexible line to said first strip transmission line assembly, wherein said first strip transmission line assembly includes a first dielectric substrate, a first conductor formed on a first surface of said first substrate, and a first ground plane layer formed on a second surface of said first substrate, wherein said first interconnection means includes, (i) means for forming a first electrical interconnection between said first conductor strip and said microstrip conductor, (ii) means for forming a second electrical interconnection between and first ground plane layer of said first strip transmission line assembly and said ground plane of said conductive microstrip of said flexible line, (iii) a first conductive plated through hole formed through said thin dielectric layer and interconnecting said microstrip ground plane and a first conductive pad formed on said second surface of said flexible substrate, (iv) a second conductive pad formed on said first surface of said substrate and spaced from said first conductor strip, (v) a second conductive plated through hole formed through said first substrate and connecting said first ground plane and said second conductive pad, said second conductive pad in electrical connection with said first conductive pad, and (vi) said microstrip conductor strip in electrical connection with said first conductor strip;

wherein said first interconnection means provides surface mount attachment of said first end of said flexible line to a surface defined by said first strip transmission line assembly; and second interconnection means for interconnecting a second end of said flexible line to said second strip transmission line.

8. The apparatus of claim 7 wherein said microstrip flexible transmission line is passed through a 360 degree loop between said first and second strip transmission line assemblies to provide strain relief.

9. The apparatus of claim 7 wherein said flexible microstrip flexible transmission line assembly includes a flexible printed wiring board.

10. The apparatus of claim 7 wherein said flexible transmission line assembly includes a thin flexible dielectric protective coating formed over said microstrip center conductor strip.

11. The apparatus of claim 7 wherein said fist conductive paid is soldered to said second conductive paid to provide electrical connection therebetween.

12. The apparatus of claim 7 wherein said first conductive pad is adhered to said second conductive pad by conductive epoxy.

13. The apparatus of claim 7 wherein said microstrip conductor is soldered to said first strip conductor.

14. The apparatus of claim 7 wherein said microstrip conductor is adhered to said first strip conductor by conductive epoxy.

* * * * *